(12) United States Patent
Anjo et al.

(10) Patent No.: US 6,433,408 B1
(45) Date of Patent: Aug. 13, 2002

(54) HIGHLY INTEGRATED CIRCUIT INCLUDING TRANSMISSION LINES WHICH HAVE EXCELLENT CHARACTERISTICS

(75) Inventors: Kenichiro Anjo; Masayuki Mizuno, both of Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/477,963

(22) Filed: Jan. 5, 2000

(30) Foreign Application Priority Data

Jan. 8, 1999 (JP) .......................................... 11-003539

(51) Int. Cl.[7] .............................................. H01L 29/40
(52) U.S. Cl. ...................... 257/664; 257/259; 257/662; 438/167; 438/186; 333/238
(58) Field of Search ................................ 257/664, 259, 257/662; 438/167, 186; 333/238

(56) References Cited

U.S. PATENT DOCUMENTS

| 5,185,502 | A | * | 2/1993 | Shepherd et al. | ............ | 174/262 |
| 5,278,524 | A | * | 1/1994 | Mullen | ............ | 333/1 |
| 5,426,399 | A | * | 6/1995 | Matsubayashi et al. | ......... | 333/1 |
| 5,479,138 | A | * | 12/1995 | Kuroda et al. | ................... | 333/1 |
| 5,652,557 | A | * | 7/1997 | Ishikawa | ................... | 333/243 |
| 5,986,527 | A | * | 11/1999 | Ishikawa et al. | ............ | 333/239 |
| 6,144,268 | A | * | 11/2000 | Matsui et al. | ................ | 333/134 |
| 6,236,572 | B1 | * | 5/2001 | Teshome et al. | ............ | 361/794 |

FOREIGN PATENT DOCUMENTS

| JP | 63222442 | | 9/1988 | .......... H01L/21/90 |
| JP | 02001928 | * | 1/1990 | ................. 257/664 |
| JP | 02083953 | * | 3/1990 | ................. 257/664 |
| JP | 4261022 | | 9/1992 | ....... H01L/21/3205 |
| JP | 522004 | | 1/1993 | ............ H01P/3/08 |
| JP | 685158 | | 3/1994 | .......... H01L/23/50 |
| JP | 758526 | | 3/1995 | ............ H01P/3/08 |
| JP | 9-199910 | | 7/1997 | ............ H01P/3/08 |
| JP | 09199910 | * | 7/1997 | |

* cited by examiner

Primary Examiner—Eddie Lee
Assistant Examiner—Eugene Lee
(74) Attorney, Agent, or Firm—Hayes Soloway P.C.

(57) ABSTRACT

An integrated circuit is composed of a substrate, a first conductor formed on the substrate, an insulating film formed on the first conductor and the substrate, a second conductor formed on the insulating film, a first interconnection formed in the insulating film and a second interconnection formed on the insulating film. The first conductor and the second conductor constitute a pair of transmission lines. The first interconnection and the second interconnection constitute a circuit. The pair of transmission lines and the circuit are separated such that the circuit does not substantially interfere electrically with the pair of transmission lines.

17 Claims, 4 Drawing Sheets

HIGHLY INTEGRATED CIRCUIT INCLUDING TRANSMISSION LINES WHICH HAVE EXCELLENT CHARACTERISTICS

BACKGROUND OF THE INVENTION

1. Field of the Invention

The present invention is related to an integrated circuit with transmission lines and a method of manufacturing the same. More particularly, the present invention relates to a highly integrated circuit with transmission lines which have excellent characteristics and a method of manufacturing the same.

2. Description of the Related Art

In an integrated circuit, its speed has been made faster, its frequency has been made higher and its integration density has been made further denser. These factors increase the importance of an integrated circuit with transmission lines between semiconductor devices. Conventionally, such an integrated circuit is known in Japanese Laid Open Patent Application (JP-A-Showa 63-222442).

In this reference, a first grounded metallic element is formed on a GaAs semiconductor substrate. A dielectric substance is formed on the first grounded metallic element. A second metallic element is formed on the dielectric substance. The second metallic element is a signal line. The first and second metallic elements constitute a pair of transmission lines.

The conventional integrated circuit does not achieve a pair of transmission lines having excellent characteristics and highly integrated density at the same time. In the conventional integrated circuit, a film thickness of an interlayer insulating film required to give excellent characteristics to the pair of transmission lines does not belong to a range of a film thickness of an interlayer insulating film allowable for a highly integrated circuit. Its reason will be described below in detail.

A signal attenuation factor D of a pair of transmission lines and a characteristic impedance Z depend on an interval d between a signal line and a ground line of the pair of transmission lines. A signal attenuation factor D and a characteristic impedance Z are respectively represented as follows:

$$D = \exp\left\{l \cdot R_{int} \cdot \frac{w}{2d} \cdot \left(\frac{\varepsilon}{\mu}\right)^{1/2}\right\} \quad (1)$$

$$Z = \frac{d}{w} \cdot \left(\frac{\mu}{\varepsilon}\right)^{1/2} \quad (2)$$

where $1$ is a length of the pair of transmission lines, $R_{int}$ is a resistance per unit length of a conductor used in the pair of transmission lines, w is a width of the lines, $\in$ is a dielectric constant of a dielectric substance between the ground line and the signal line, and $\mu$ is a magnetic permeability of the dielectric substance.

It is desirable that the signal attenuation factor D of the transmission line is low. In addition, it is desirable that the characteristic impedance Z has a predetermined value. From the consideration of the signal attenuation factor D, the characteristic impedance Z, and the physical constants of materials used in the integrated circuit, it is necessary that the interval d between the signal line and the ground line is around 2 $\mu$m. In the conventional integrated circuit, an interlayer insulating film is used as the dielectric substance of the transmission line. Thus, from the viewpoint of the characteristic of the transmission line, it is desirable that the thickness of the interlayer insulating film is about 2 $\mu$m.

However, in a highly integrated circuit, it is not allowable that an interlayer insulating film have a thickness of 2 $\mu$m. The reason is that a diameter of a contact hole is small in a highly integrated circuit. For example, let us suppose a design rule of 0.25 $\mu$m. A diameter of a contact hole based on the design rule of 0.25 m is about 0.4 $\mu$m. Here, let us suppose that the thickness of an interlayer insulating film is about 2 $\mu$m, which is desirable in an aspect of the characteristics of the transmission line. The aspect ratio of the contact hole is about 5. Such a contact hole is extremely difficult to be formed.

Other integrated circuits having transmission lines are known in Japanese Laid Open Patent Applications (JP-A-Heisei 4-261022, JP-A Heisei 5-22004, JP-A-Heisei 6-85158 and JP-A-Heisei 7-58526). However, any of the integrated circuits does not achieve excellent characteristics of the transmission line with highly integrated structure.

A highly integrated circuit with transmission lines which have excellent characteristics is desirable.

SUMMARY OF THE INVENTION

Therefore, an object of the present invention is to provide an integrated circuit which can achieve transmission lines having excellent characteristics and a highly integrated circuit at the same time. Another object of the present invention is to provide an integrated circuit with transmission lines in which the manufacturing process is easy. Still another object of the present invention is to provide an integrated circuit with transmission lines which are not affected easily by the electrical interference.

In order to achieve an aspect of the present invention, an integrated circuit is composed of a substrate, a first conductor formed on the substrate, an insulating film formed on the first conductor and the substrate, a second conductor formed on the insulating film, a first interconnection formed in the insulating film and a second interconnection formed on the insulating film. The first conductor and the second conductor constitute a pair of transmission lines.

The first interconnection and the second interconnection constitute a circuit. The pair of transmission lines and the circuit are separated such that the circuit does not substantially interfere electrically with the pair of transmission lines.

The insulating film includes a plurality of interlayer insulating films. The first interconnection is placed between two of the plurality of interlayer in sulating films.

Thicknesses of the plurality of interlayer insulating films may be defined based on characteristic impedance of the pair of transmission lines.

At least one of the plurality of interlayer insulating films may be formed of dielectric material having a dielectric constant smaller than that of silicon dioxide.

Thickness of the first conductor may be substantially equal to or less than a skin depth determined based on a signal transmitted on the pair of transmission lines.

Thickness of the second conductor may be substantially equal to or less than a skin depth determined based on a signal transmitted on the pair of transmission lines.

The substrate may be made of semiconductor. In this case, a diffusion layer may be formed in surface portion of the substrate. In this case, the first conductor is formed on the diffusion layer.

The substrate may include a semiconductor substrate and a plurality of silicon oxide films which are formed on the semiconductor substrate at the same time. In this case, the first conductor is formed on one of the plurality of silicon oxide films. Remaining ones of plurality of silicon oxide films are used as gate oxide films of MOS transistors.

In order to achieve another aspect of the present invention, a method of manufacturing an integrated circuit is composed of forming a first conductor on a substrate, forming an insulating film on the first conductor and the substrate, forming a first interconnect in the insulating film, forming a first interconnect in the insulating film and forming a second conductor and a second interconnect on the insulating film at the same time. The first conductor and the second conductor constitute a pair of transmission lines, and the first interconnection and the second interconnection constitute a circuit. The pair of transmission lines and the circuit are separated such that the circuit does not substantially interfere electrically with the pair of transmission lines.

The forming an insulating film includes forming a plurality of interlayer insulating films such that the first interconnection is placed between two of the plurality of interlayer insulating films.

Thicknesses of the plurality of interlayer insulating films may be defined based on characteristic impedance of the pair of transmission lines.

At least one of the plurality of interlayer insulating films may be made of dielectric material having a dielectric constant smaller than that of silicon dioxide.

Thickness of the first conductor may be equal to or less than a skin depth determined based on a signal transmitted on the pair of transmission lines.

Thickness of the second conductor may be equal to or less than a skin depth determined based on a signal transmitted on the pair of transmission lines.

DESCRIPTION OF THE PREFERRED EMBODIMENTS

An integrated circuit according to the present invention will be described below in detail with reference to the attached drawings.

Figure 1:
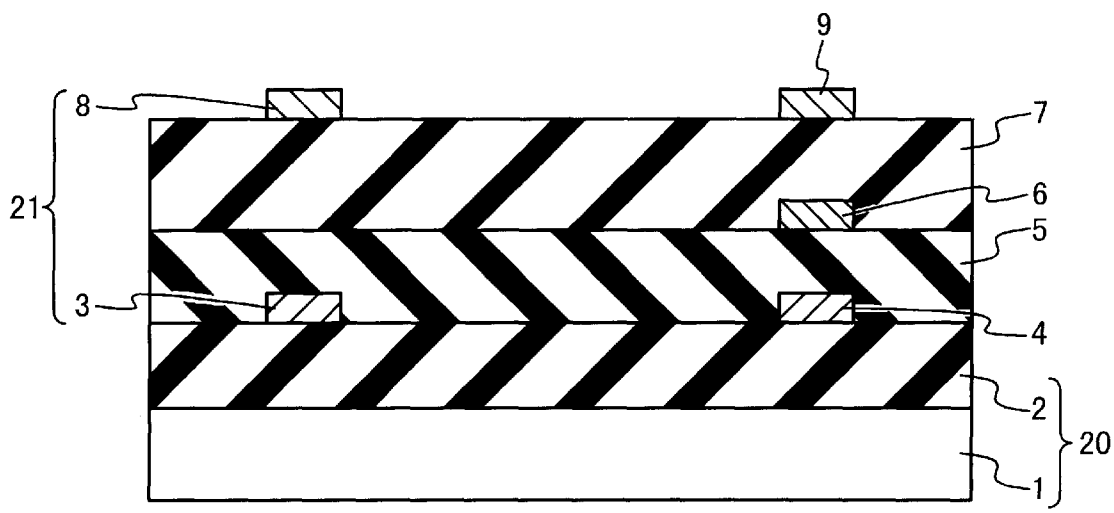
FIG. 1 shows a structure of an integrated circuit of a first embodiment according to the present invention.

An integrated circuit of a first embodiment according to the present invention is provided with a substrate and a first conductor. With reference to FIG. 1, the substrate 20 is composed of a semiconductor substrate 1 and an insulating layer 2. The insulating layer 2 is formed on the semiconductor substrate 1. The first conductor 3 is formed on the insulating layer 2. The first conductor 3 is a ground line of a pair of transmission lines 21. The first conductor may be a signal line of the pair of transmission lines 21. A first wiring layer 4 is also formed on the insulating layer 2. The first conductor 3 and the first wiring layer 4 are formed at the same time. The first wiring layer 4 constitutes a circuit contained in the integrated circuit.

A first interlayer insulating film 5 covers the first conductor 3 and the first wiring layer 4. The first interlayer insulating film 5 is joined to the insulating layer 2. A second wiring layer 6 is formed connectedly to the first interlayer insulating film 5. The second wiring layer 6 constitutes a circuit contained in the integrated circuit.

A second interlayer insulating film 7 covers the second wiring layer 6. The second interlayer insulating film 7 is joined to the first interlayer insulating film 5. A second conductor 8 is formed on the second interlayer insulating film 7. The second conductor 8 is a signal line of the pair of transmission lines 21. The second conductor 8 may be a ground line of the pair of transmission lines 21, if the first conductor 3 is the signal line. The second conductor 8 is placed above a direction vertical to a surface of the substrate 20 with respect to the first conductor 3. A third wiring layer 9 is formed on the second interlayer insulating film 7. The third wiring layer 9 constitutes a circuit which is not the pair of transmission lines 21 among the circuits contained in the integrated a circuit. The third wiring layer 9 and the second conductor 8 are formed at the same time.

The first conductor 3 and the second conductor 8 are used as the pair of transmission lines 21. The first wiring layer 4, the second wiring layer 6 and the third wiring layer 9 are used as a circuit contained in the integrated circuit, which is not the pair of transmission lines. The first wiring layer 4, the second wiring layer 6 and the third wiring layer 9 are separated to the degree that they do not interfere electrically with the transmission line 21, from the first conductor 3 and the second conductor 8.

The insulating layer 2, the first interlayer insulating film 5 and the second interlayer insulating film 7 are made of silicon oxide. The insulating layer 2, the first interlayer insulating film 5 and the second interlayer insulating film 7 may be made of other insulators. For the first interlayer insulating film 5 and the second interlayer insulating film 7, it is desirable to use materials having low dielectric constants, for example, SiOF, amorphous carbon or fluoroethylene resin. This is because the use of the materials having the low dielectric constants to form the first interlayer insulating film 5 and the second interlayer insulating film 7 is advantageous in reducing the signal attenuation factor D of the transmission line, as can be understood from the equation (1).

The reduction of the signal attenuation factor D enables a maximum length of the pair of transmission lines 21 to be longer. Also, the use of the materials having the low dielectric constants to form the first interlayer insulating film 5 and the second interlayer insulating film 7 is advantageous in making a signal transmission velocity v in the transmission line faster. This is because a signal transmission velocity v in a pair of transmission lines is represented by:

$$v = \frac{1}{\sqrt{\varepsilon\mu}} \quad (3)$$

Making the signal transmission velocity v in the pair of transmission lines 21 faster enables a wiring delay to be reduced. Moreover, the use of materials having the low dielectric constants to form the first interlayer insulating film 5 and the second interlayer insulating film 7 is effective in suppressing cross talk between the pair of transmission lines 21 and the circuit composed of the first wiring layer 4, the second wiring layer 6 and the third wiring layer 9. This is because parasitic capacitance between the pair of transmission lines 21 and the circuit can be reduced.

Thicknesses of the first interlayer insulating film 5 and the second interlayer insulating film 7 are determined on the basis of characteristics of the pair of transmission lines 21. Particularly, the thicknesses of the first interlayer insulating film 5 and the second interlayer insulating film 7 are determined on the basis of characteristic impedance of the pair of transmission lines 21. The interval d between a signal line and a ground line is the sum of the thicknesses of the first interlayer insulating film 5 and the second interlayer insulating film 7. As understood by equations (1) and (2), characteristics of the pair of transmission lines 21 can be adjusted by the thicknesses of the first interlayer insulating film 5 and the second interlayer insulating film 7.

The first conductor 3, the second conductor 8, the first wiring layer 4, the second wiring layer 6 and the third wiring layer 9 are formed of aluminum. The first conductor 3, the second conductor 8, the first wiring layer 4, the second wiring layer 6 and the third wiring layer 9 may be formed by using other conductors, for example, copper, polysilicon and the like. It is desirable to use a metal having a low specific resistance for the first conductor 3 and the second conductor 8. This is because it is advantageous in reducing the signal attenuation factor D, as understood from the equation (1).

Conductor thicknesses of the first conductor 3 and the second conductor 8 are determined on the basis of a skin depth δ. It is desirable that the conductor thicknesses of the first conductor 3 and the second conductor 8 are substantially equal to or thinner than the skin depth δ. Its reason is as follows. The skin depth δ implies a distance from a surface of a conductor in which a strength of its magnetic field is 1/e of a strength of a magnetic field on the surface of the conductor, where e is the base of the natural logarithm. A skin depth δ is represented by:

$$\delta = \left(\frac{2}{\omega\mu\sigma}\right)^{1/2} \quad (4)$$

where ω is an angular frequency of a signal transmitted, and σ is an electric conductivity of conductors of a pair of transmission lines. Then, the skin depth δ is 0.66 μm when copper is used as a conductor and a frequency of a transmission signal is 10 GHz. The skin depth δ is 0.87 μm when aluminum is used as a conductor and a frequency of a transmission signal is 10 GHz. The signal attenuation factor D cannot be reduced even if the thickness of the conductor is greater than the skin depth δ. The reason is that a resistance $R_{int}$ per length of the conductor in the equation (1) cannot be reduced, even if the thickness of the conductor is greater than the skin depth δ because of the skin effect. Since the conductor thicknesses of the first conductor 3 and the second conductor 8 are substantially equal to or thinner than the skin depth δ, the integrated circuit of the first embodiment is able to reduce step differences in the structure, while the characteristics of the transmission line 20 is maintained.

In the integrated circuit of the first embodiment, it is possible to adequately reserve a distance between the first conductor 3 and the second conductor 8 which constitute the transmission line, namely, a distance between the signal line and the ground line in the transmission line. Simultaneously, the first wiring layer 4, the second wiring layer 6 and the third wiring layer 9 can be electrically insulated from each other without using a thick interlayer insulating film. The non-use of the thick interlayer insulating film enables a contact hole of a thin diameter to be formed. As a result, the integrated circuit is able to be highly integrated while the excellent characteristic of the transmission line is kept.

Figure 5:
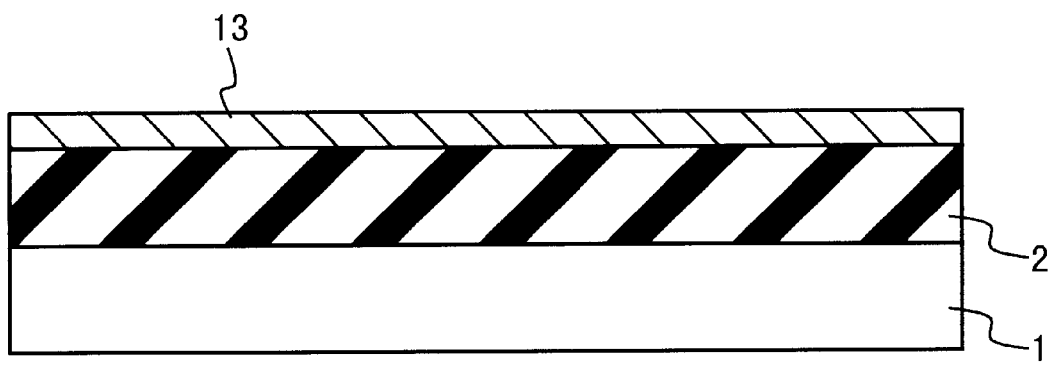
FIG. 5 shows a process of manufacturing the integrated circuit of the first embodiment according to the present invention, namely, shows a structure after a formation of a first conductor 10.
Figure 6:
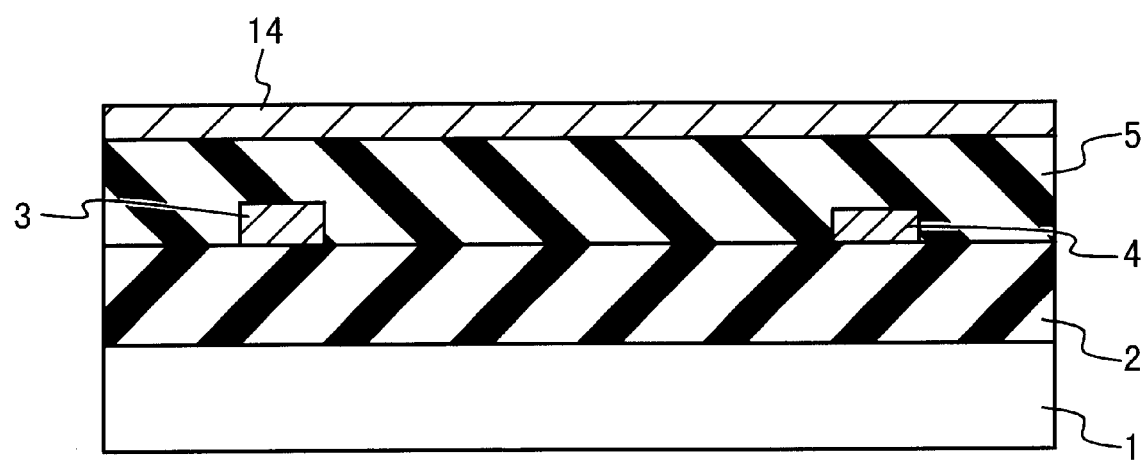
FIG. 6 shows a process of manufacturing the integrated circuit of the first embodiment according to the present invention, namely, shows a structure after a formation of a second conductor 11.
Figure 7:
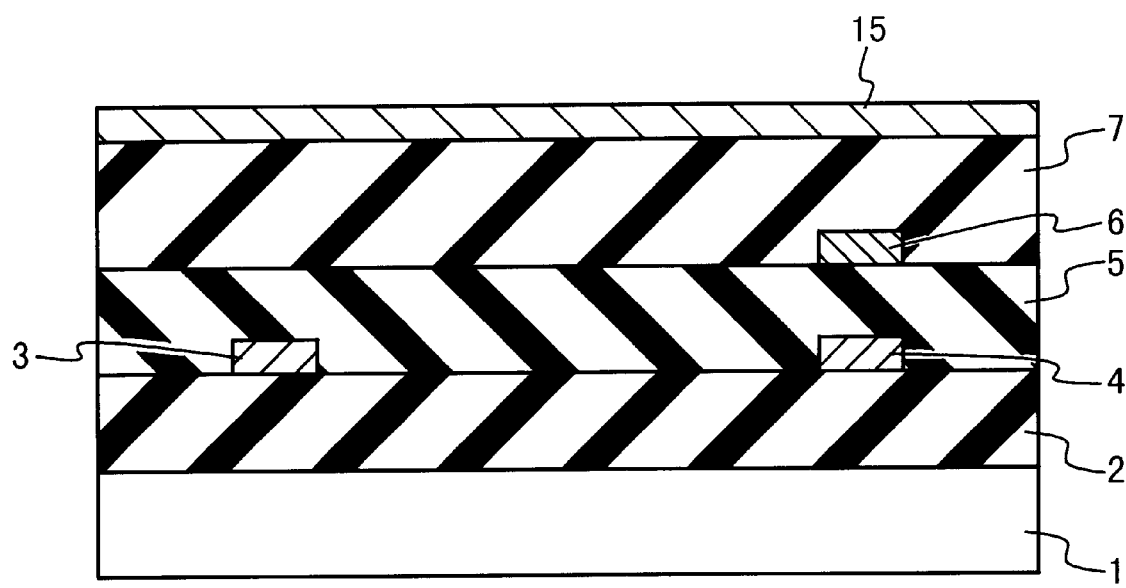
FIG. 7 shows a process of manufacturing the integrated circuit of the first embodiment according to the present invention, namely, shows a structure after a formation of a third conductor 12.

A method of manufacturing the integrated circuit of the first embodiment will be described below. At first, the insulating layer 2 is formed on the semiconductor substrate 1. A first conductive film 10 is formed on the insulating layer 2. FIG. 5 shows a sectional structure after the formation of the first conductive film 10. The first conductive film 10 is patterned to accordingly form the first conductor 3 and the first wiring layer 4. The first interlayer insulating film 5 is formed so as to cover the first conductor 3 and the first wiring layer 4. A second conductive film 11 is formed on the first interlayer insulating film 5. FIG. 6 shows a sectional structure after the formation of the second conductive film 11. The second conductive film 11 is patterned to accordingly form the second wiring layer 6. The second interlayer insulating film 7 is formed so as to cover the second wiring layer 6. A third conductive film 12 is formed on the second interlayer insulating film 7. FIG. 7 shows a sectional structure after the formation of the third conductive film 12. The third conductive film 12 is patterned to accordingly form the second conductor 8 and the third wiring layer 9. Here, the first wiring layer 4, the second wiring layer 6 and the third wiring layer 9 are formed away from the first conductor 3 and the second conductor 8, to the degree without the substantially electric interference. The steps of manufacturing the integrated circuit shown in FIG. 1 are completed by the above-mentioned processes.

Figure 2:
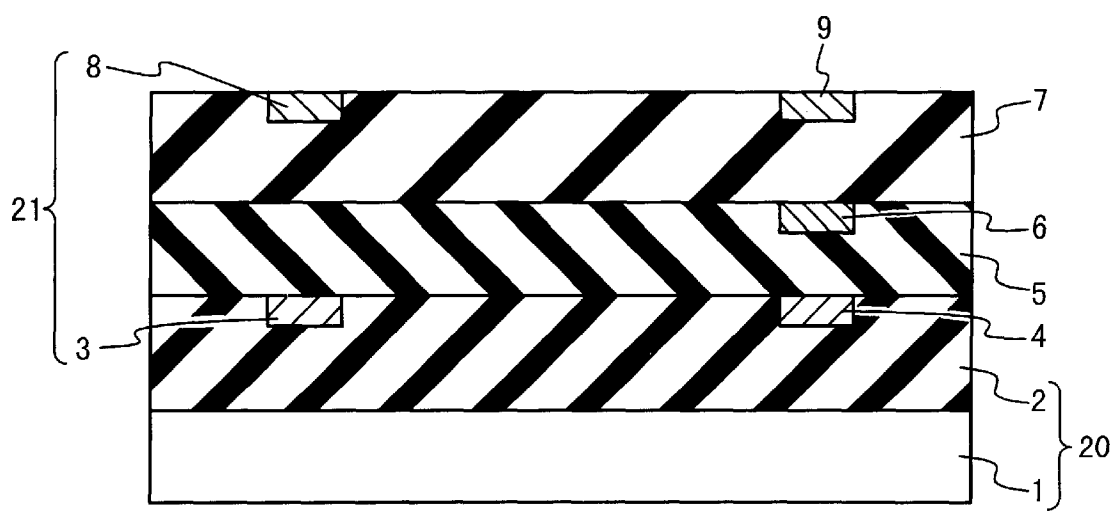
FIG. 2 shows a structure of the integrated circuit of the first embodiment according to the present invention, when a transmission line and a conductor in another circuit are embedded in grooves fabricated on interlayer insulating films.

Incidentally, in the first embodiment, three or more interlayer insulating films may exist between the first conductor 3 and the second conductor 8. In this case, another wiring layer may exist between the interlayer insulating films. Moreover, it is possible to design the configuration in which the wiring layer and the interlayer insulating film are present below the first conductor 3. Moreover, as shown in FIG. 2, it is possible to design the configuration in which the conductors constituting the circuits other than the transmission lines are embedded in grooves fabricated on the insulating film and/or the interlayer insulating films. A dual damascene process is used in this case.

Figure 3:
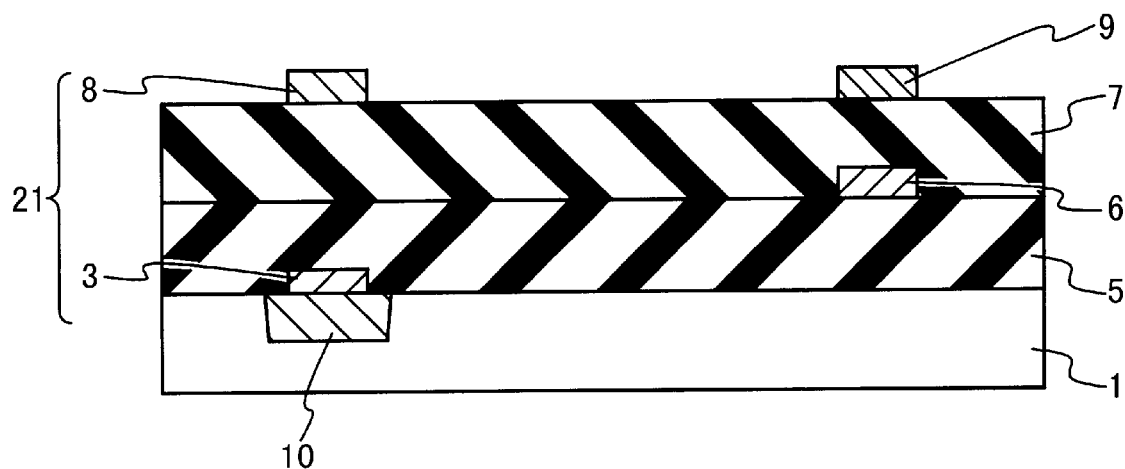
FIG. 3 shows a structure of an integrated circuit of a second embodiment according to the present invention.
Figure 4:
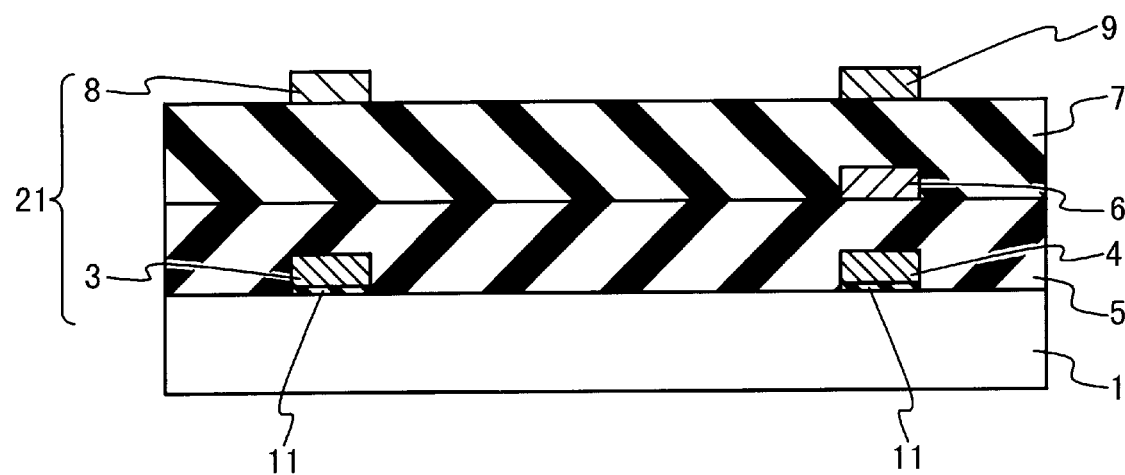
FIG. 4 shows a structure of an integrated circuit of a third embodiment according to the present invention.

An integrated circuit of a second embodiment according to the present invention is described in succession. FIG. 3 shows the structure of the integrated circuit of the second embodiment according to the present invention. The integrated circuit of the second embodiment according to the present invention has the structure substantially similar to that of the first embodiment. The integrated circuit of the second embodiment differs from the integrated circuit of the first embodiment, in the following three points. Firstly, the insulating layer 2 is not present. The first conductor 3 and the first interlayer insulating film 5 are directly joined to the semiconductor substrate 1. Secondly, the first conductor 3 is joined to a diffusion layer 10 formed in the surface portion of the semiconductor substrate 1. And thirdly, the first conductor 3 is limited to the ground line, and the second conductor 8 is limited to the signal line. It is not allowed to use the first conductor 3 as the signal line and also impossible to use the second conductor 8 as the ground line. This is because the first conductor 3 is joined to the diffusion layer 10.

In the integrated circuit of the second embodiment, the integrated circuit can be highly integrated while excellent characteristics of the pair of transmission lines 21 is kept, similarly to the integrated circuit of the first embodiment. In addition, the integrated circuit of the second embodiment can be applied to an integrated circuit having double level interconnection structure, while the integrated circuit of the first embodiment can not be applied to an integrated circuit having double level interconnection structure An integrated circuit of a third embodiment according to the present invention is described in succession. FIG. 3 shows the structure of the integrated circuit of the third embodiment according to the present invention. The integrated circuit of the third embodiment according to the present invention has a structure substantially similar to that of the first embodiment. The difference is that an insulator 2 is a gate insulating film 11. The first wiring layer 4 can be used as a gate of a transistor. Although the integrated circuit of the first embodiment can not be applied to the integrated circuit having double level interconnection, the integrated circuit of the third embodiment can be applied to an integrated circuit having double level interconnection.

A first effect of the present invention is to provide a integrated circuit which can achieve a pair of transmission lines having excellent characteristics and a highly integrated circuit at the same time. This effect can be attained by the formation of a plurality of interlayer insulating films between conductors constituting a pair of transmission lines. Interconnects are placed between the plurality of interlayer insulating films. The interconnects constitute a circuit. The interconnects are placed away from the pair of transmission lines to the degree that they do not interfere electrically. In the integrated circuit according to the present invention, a pair of transmission lines having desired electric characteristics can be formed while a thickness of an interlayer insulating film of a single layer is made thin. On the other hand, the contact hole of the small diameter can be formed since the thickness of the interlayer insulating film is thin. Thus, the integrated circuit can be highly integrated.

A second effect of the present invention is to provide an integrated circuit with a pair of transmission lines in which the manufacturing process is easy. This effect can be attained by the fact that the thickness of the conductor constituting the pair of transmission lines is equal to or less than the skin depth. The thickness of the conductor constituting the transmission line is determined as the necessary thickness from the. viewpoint of the characteristic. As a result, the step difference of the integrated circuit is made smaller to thereby make the manufacturing process easier, while excellence in characteristics of the transmission lines are maintained.

A third effect of the present invention is to provide an integrated circuit with a pair of transmission lines in which the electric interference is small. This is because materials having low dielectric constants are used as interlayer insulating films positioned between the conductors constituting the pair of transmission lines. This effect can be attained by the small parasitic capacitance.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. An integrated circuit comprising;
   a substrate;
   a first conductor formed on said substrate;
   an insulating film formed on said first conductor and said substrate;
   a second conductor formed on said insulating film;
   a first interconnection formed in said insulating film;
   a second interconnection formed on said insulating film, wherein said first conductor and said second conductor constitute a pair of transmission lines, and said first interconnection and said second interconnection constitute a circuit, and said pair of transmission lines and said circuit are separated such that said circuit does not substantially interfere electrically with said pair of transmission lines; and,
   wherein said insulating film includes a plurality of interlayer insulating films and said first interconnection is placed between two of said plurality of interlayer insulating films.

2. An integrated circuit according to claim 1, wherein thicknesses of said plurality of interlayer insulating films are defined based on characteristic impedance of said pair of transmission lines.

3. An integrated circuit according claim 1, wherein at least one of said plurality of interlayer insulating films are formed of dielectric material having a dielectric constant smaller than that of silicon dioxide.

4. An integrated circuit comprising:
   a substrate;
   a first conductor formed on said substrate;
   an insulating film formed on said first conductor and said substrate;
   a second conductor formed on said insulating film;
   a first interconnection formed in said insulating film;
   a second interconnection formed on said insulating film, wherein said first conductor and said second conductor constitute a pair of transmission lines, and said first interconnection and said second interconnection constitute a circuit, and said pair of transmission lines and said circuit are separated such that said circuit does not substantially interfere electrically with said pair of transmission lines; and,
   wherein thickness of said first conductor is substantially equal to or thinner than a skin depth determined based on a signal transmitted on said pair of transmission lines.

5. An integrated circuit comprising:
   a substrate;
   a first conductor formed on said substrate;
   an insulating film formed on said first conductor and said substrate;
   a second conductor formed on said insulating film;
   a first interconnection formed in said insulating film;
   a second interconnection formed on said insulating film, wherein said first conductor and said second conductor constitute a pair of transmission lines, and said first interconnection and said second interconnection constitute a circuit, and said pair of transmission lines and said circuit are separated such that said circuit does not substantially interfere electrically with said pair of transmission lines; and,
   wherein thickness of said second conductor is substantially equal to or thinner than a skin depth determined based on a signal transmitted on said pair of transmission lines.

6. An integrated circuit comprising:

a substrate;

a first conductor formed on said substrate;

an insulating film formed on said first conductor and said substrate;

a second conductor formed on said insulating film;

a first interconnection formed in said insulating film;

a second interconnection formed on said insulating film, wherein said first conductor and said second conductor constitute a pair of transmission lines, and said first interconnection and said second interconnection constitute a circuit, and said pair of transmission lines and said circuit are separated such that said circuit does not substantially interfere electrically with said pair of transmission lines; and, wherein said substrate is made of semiconductor, and a diffusion layer is formed in surface portion of said substrate, and said first conductor is formed on said diffusion layer.

7. An integrated circuit according to claim 6, wherein said insulating film includes a plurality of interlayer insulating films and said first interconnection is placed between two of said plurality of interlayer insulating films.

8. An integrated circuit according to claim 7, wherein thicknesses of said plurality of interlayer insulating films are defined based on characteristic impedance of said pair of transmission lines.

9. An integrated circuit according to claim 7, wherein at least one of said plurality of interlayer insulating films are formed of dielectric material having a dielectric constant smaller than that of silicon dioxide.

10. An integrated circuit according to claim 6, wherein thickness of said first conductor is substantially equal to thinner than a skin depth determined based on a signal transmitted on said a pair of transmission lines.

11. An integrated circuit according to claim 6, wherein thickness of said second conductor is substantially equal to less than a skin depth determined based on a signal transmitted on said a pair of transmission lines.

12. An integrated circuit comprising:

a substrate;

a first conductor formed on said substrate;

an insulating film formed on said first conductor and said substrate;

a second conductor formed on said insulating film;

a first interconnection formed in said insulating film;

a second interconnection formed on said insulating film, wherein said first conductor and said second conductor constitute a pair of transmission lines, and said first interconnection and said second interconnection constitute a circuit, and said pair of transmission lines and said circuit are separated such that said circuit does not substantially interfere electrically with said pair of transmission lines;

wherein said substrate includes a semiconductor substrate; and, a plurality of silicon oxide films which are formed on said semiconductor substrate at the same time, wherein said first conductor is formed on one of said plurality of silicon oxide films and remaining ones of plurality of silicon oxide films are used as gate oxide films of MOS transistors.

13. An integrated circuit according to claim 12, wherein said insulating film includes a plurality of interlayer insulating films and said first interconnection is placed between two of said plurality of interlayer insulating films.

14. An integrated circuit according to claim 13, wherein thicknesses of said plurality of interlayer insulating films are defined based on characteristic impedance of said pair of transmission lines.

15. An integrated circuit according to claim 13, wherein at least one of said plurality of interlayer insulating films are made of dielectric material having a dielectric constant smaller than that of silicon dioxide.

16. An integrated circuit according to claim 12, wherein thickness of said first conductor is substantially equal to or less than a skin depth determined based on a signal transmitted on said pair of transmission lines.

17. An integrated circuit according to claim 12, wherein thickness of said second conductor is substantially equal to or less than a skin depth determined based on a signal transmitted on said pair of transmission lines.

* * * * *